United States Patent
Narla et al.

(10) Patent No.: US 9,948,254 B2
(45) Date of Patent: Apr. 17, 2018

(54) WIRELESS JOSEPHSON BIFURCATION AMPLIFIER

(71) Applicant: Yale University, New Haven, CT (US)

(72) Inventors: Anirudh Narla, New Haven, CT (US); Katrina Sliwa, New Haven, CT (US); Michael Hatridge, New Haven, CT (US); Shyam Shankar, New Haven, CT (US); Luigi Frunzio, North Haven, CT (US); Robert J. Schoelkopf, III, Madison, CT (US); Michel Devoret, New Haven, CT (US)

(73) Assignee: Yale University, New Haven, CT (US)

( * ) Notice: Subject to any disclaimer, the term of this patent is extended or adjusted under 35 U.S.C. 154(b) by 263 days.

(21) Appl. No.: 14/628,107

(22) Filed: Feb. 20, 2015

(65) Prior Publication Data
US 2015/0241481 A1    Aug. 27, 2015

Related U.S. Application Data

(60) Provisional application No. 61/943,150, filed on Feb. 21, 2014.

(51) Int. Cl.
    *H03F 19/00*      (2006.01)

(52) U.S. Cl.
    CPC ..................... *H03F 19/00* (2013.01)

(58) Field of Classification Search
    CPC ..... H03F 19/00; H01L 39/025; H01L 39/045; H01L 39/22; H01L 39/223
    USPC .............................................. 327/367; 326/3
    See application file for complete search history.

(56) References Cited

U.S. PATENT DOCUMENTS

| | | | |
|---|---|---|---|
| 4,344,052 A | 8/1982 | Davidson | |
| 4,403,189 A | 9/1983 | Simmonds | |
| 4,585,999 A | * 4/1986 | Hilbert | H03F 19/00 257/36 |
| 4,956,312 A | 9/1990 | Van Laarhoven | |

(Continued)

FOREIGN PATENT DOCUMENTS

| | | |
|---|---|---|
| EP | 0 513 856 A2 | 11/1992 |
| EP | 2 249 173 A1 | 11/2010 |

(Continued)

OTHER PUBLICATIONS

Bergeal et al., Analog information processing at the quantum limit with a Josephson ring modulator. Nat Phys. Apr. 2010;6(4):296-302. doi: 10.1038/NPHYS1516. Epub Feb. 14, 2010. 7 pages.

(Continued)

*Primary Examiner* — Walter L Lindsay, Jr.
*Assistant Examiner* — Billy Lactaoen
(74) *Attorney, Agent, or Firm* — Wolf, Greenfield & Sacks, P.C.

(57) ABSTRACT

A wireless Josephson-junction-based amplifier is described that provides improved tunability and increased control over both a quality factor Q and participation ratio p of the amplifier. The device may be fabricated on a chip and mounted in a waveguide. No wire bonding between the amplifier and coaxial cables or a printed circuit board is needed. At least one antenna on the chip may be used to couple energy between the waveguide and wireless JBA. The amplifier is capable of gains greater than 25 dB.

6 Claims, 6 Drawing Sheets

(56) References Cited

U.S. PATENT DOCUMENTS

| | | |
|---|---|---|
| 5,105,166 A | 4/1992 | Tsukii et al. |
| 5,254,950 A | 10/1993 | Fan et al. |
| 5,326,986 A | 7/1994 | Miller, Jr. et al. |
| 5,493,719 A | 2/1996 | Smith et al. |
| 5,635,834 A | 6/1997 | Sloggett et al. |
| 6,549,059 B1 | 4/2003 | Johnson |
| 6,578,018 B1 | 6/2003 | Ulyanov |
| 6,621,374 B2 | 9/2003 | Higgins et al. |
| 6,627,915 B1 | 9/2003 | Ustinov et al. |
| 6,635,898 B2 | 10/2003 | Williams et al. |
| 6,822,255 B2 | 11/2004 | Tzalenchuk et al. |
| 6,838,694 B2 | 1/2005 | Esteve et al. |
| 6,900,454 B2 | 5/2005 | Blais et al. |
| 6,911,664 B2 | 6/2005 | Il'ichev et al. |
| 6,943,368 B2 | 9/2005 | Amin et al. |
| 7,042,005 B2 | 5/2006 | Il'ichev et al. |
| 7,129,869 B2 | 10/2006 | Furuta et al. |
| 7,253,654 B2 | 8/2007 | Amin |
| 7,307,275 B2 | 12/2007 | Lidar et al. |
| 7,364,923 B2 | 4/2008 | Lidar et al. |
| 7,369,093 B2 | 5/2008 | Oppenländer et al. |
| 7,533,068 B2 | 5/2009 | Maassen van den Brink et al. |
| 7,724,083 B2 | 5/2010 | Herring et al. |
| 7,800,395 B2 | 9/2010 | Johnson et al. |
| 7,876,248 B2 | 1/2011 | Berkley et al. |
| 7,899,092 B2 | 3/2011 | Malinovsky |
| 7,932,515 B2 | 4/2011 | Bunyk |
| 8,032,474 B2 | 10/2011 | Macready et al. |
| 8,106,717 B2 | 1/2012 | Ichimura et al. |
| 8,111,083 B1 | 2/2012 | Pesetski et al. |
| 8,138,784 B2 | 3/2012 | Przybysz et al. |
| 8,179,133 B1* | 5/2012 | Kornev ............ G01R 33/0354 324/225 |
| 8,416,109 B2 | 4/2013 | Kirichenko |
| 8,514,478 B1 | 8/2013 | Spence |
| 2001/0025012 A1 | 9/2001 | Tarutani et al. |
| 2002/0188578 A1 | 12/2002 | Amin et al. |
| 2003/0136973 A1 | 7/2003 | Ogawa et al. |
| 2003/0193097 A1 | 10/2003 | Il'ichev et al. |
| 2004/0059760 A1 | 3/2004 | Ageishi et al. |
| 2004/0077503 A1* | 4/2004 | Blais ............ B82Y 10/00 505/190 |
| 2004/0140537 A1 | 7/2004 | Il'ichev et al. |
| 2005/0117836 A1 | 6/2005 | Franson et al. |
| 2005/0134377 A1 | 6/2005 | Dent |
| 2005/0224784 A1 | 10/2005 | Amin et al. |
| 2006/0097747 A1* | 5/2006 | Amin ............ G06N 99/002 326/6 |
| 2006/0179029 A1 | 8/2006 | Vala et al. |
| 2007/0215862 A1 | 9/2007 | Beausoleil et al. |
| 2007/0296953 A1 | 12/2007 | Allen et al. |
| 2008/0100175 A1 | 5/2008 | Clark |
| 2008/0274898 A1 | 11/2008 | Johnson et al. |
| 2009/0028340 A1 | 1/2009 | Trifonov |
| 2009/0033369 A1 | 2/2009 | Baumgardner et al. |
| 2009/0074355 A1 | 3/2009 | Beausoleil et al. |
| 2009/0153180 A1 | 6/2009 | Herr et al. |
| 2009/0232191 A1 | 9/2009 | Gupta et al. |
| 2009/0258787 A1 | 10/2009 | Wilkie et al. |
| 2009/0289638 A1 | 11/2009 | Farinelli et al. |
| 2010/0241780 A1 | 9/2010 | Friesen |
| 2010/0246152 A1 | 9/2010 | Lin et al. |
| 2011/0060710 A1 | 3/2011 | Amin |
| 2011/0079889 A1 | 4/2011 | Baillin |
| 2012/0074509 A1 | 3/2012 | Berg et al. |
| 2012/0319085 A1 | 12/2012 | Gambetta et al. |
| 2012/0319684 A1 | 12/2012 | Gambetta et al. |
| 2012/0326130 A1 | 12/2012 | Maekawa et al. |
| 2012/0326720 A1 | 12/2012 | Gambetta et al. |
| 2013/0029848 A1* | 1/2013 | Gonzalez ............ G06N 99/002 505/210 |
| 2013/0043945 A1 | 2/2013 | McDermott et al. |
| 2013/0107352 A1 | 5/2013 | Santori et al. |
| 2013/0196855 A1 | 8/2013 | Poletto et al. |
| 2013/0271265 A1* | 10/2013 | Finn ............ H01Q 1/2225 340/10.1 |
| 2014/0314419 A1 | 10/2014 | Paik |

FOREIGN PATENT DOCUMENTS

| | | |
|---|---|---|
| EP | 2 264 799 A1 | 12/2010 |
| GB | 1 370 647 A | 10/1974 |
| JP | 2006344761 A * | 12/2006 |
| RU | 2 106 717 C1 | 3/1998 |
| RU | 2 212 671 C1 | 9/2003 |
| RU | 2010 124 198 A | 12/2011 |

OTHER PUBLICATIONS

Koch et al., Time-reversal symmetry breaking in circuit-QED based photon lattices. arXiv:1006.0762v2. Oct. 11, 2010. 19 pages.

Platenberg, Coupled superconducting flux qubits. Delft University of Technology. Thesis. 2007. 153 pages.

Wang, Memristors and Superconducting Quantum Interference Filters in RF Systems. Department of Electrical and Computer Engineering, Duke University. Thesis. Aug. 18, 2014. 119 pages.

Wendin et al., Superconducting quantum circuits, qubits and computing. arXiv:cond-mat/0508729v1. Aug. 30, 2005. 60 pages.

Houck et al., Life after charge noise: recent results with transmon qubits. Quantum Info Process. Feb. 11, 2009;8(2-3):105-15.

Abdo et al., Full coherent frequency conversion between two propagating microwave modes. Phys Rev Lett. Apr. 26, 2013;110:173902.1-5. doi: 10.1103/PhysRevLett.110.173902.

Abdo et al., Josephson directional amplifier for quantum measurement of superconducting circuits. Phys Rev Lett. Apr. 25, 2014;112:167701.1-5. doi: 10.1103/PhysRevLett.112.167701.

Abdo et al., Nondegenerate three-wave mixing with the Josephson ring modulator. Phys Rev B. Jan. 16, 2013;87(1):014508.1-18. doi: 10.1103/PhysRevB.87.014508.

Albert et al., Holonomic quantum computing with cat-codes. Apr. 10, 2015. arXiv:1503.00194v2. 5 pages.

Albert et al., Symmetries and conserved quantities in Lindblad master equations. Phys Rev A. Feb. 2014;89(2):022118. arXiv:1310.1523v2. 15 pages.

Burgarth et al., Non-Abelian phases from quantum Zeno dynamics. Phys Rev A. Oct. 9, 2013;88:042107.1-5. doi: 10.1103/PhysRevA.88.042107.

Campagne-Ibarcq et al., Persistent control of a superconducting qubit by stroboscopic measurement feedback. Phys Rev X. 2013;3:1-7. arXiv:1301.6095v2.

Carollo et al., Coherent Quantum Evolution via Reservoir Driven Holonomies. Phys Rev Lett. Jan. 18, 2006;96;020403. arXiv:quant-ph/0507229v2. 4 pages.

Carollo et al., Geometric Phase Induced by a Cyclically Evolving Squeezed Vacuum Reservoir. Phys Rev Lett. Apr. 21, 2006;96:150403. arXiv:quant-ph/0507101v2. 5 pages.

Castellanos-Beltran et al., Amplification and squeezing of quantum noise with a tunable Josephson metamaterial. Nat Phys. Dec. 2008;4(12):928-31.

Chaturvedi et al., Berry's phase for coherent states. J Phys A: Math Gen. 1987;20(16):L1071-5.

Dasgupta et al., Decoherence-induced geometric phase in a multi-level atomic system. J Phys B: At Mol Opt Phys. Apr. 18, 2007;40(9):S127. arXiv:quant-ph/0612201v1. 10 pages.

De Ponte et al., Relaxation- and decoherence-free subspaces in networks of weakly and strongly coupled resonators. Ann Phys. Mar. 12, 2007;322:2077-84.

Devoret et al., Error-Corrected Quantum Registers for a Modular Superconducting Quantum Computer. Yale White Paper: ARO/LPS. Yale University, Departments of Applied Physics and Physics. Jan. 11, 2013. 56 pages.

Devoret et al., Superconducting Circuits for Quantum Information: An Outlook. Science. Mar. 8, 2013;339:1169-74. doi: 10.1126/science.1231930.

(56) References Cited

OTHER PUBLICATIONS

Duan et al., Preserving Coherence in Quantum Computation by Pairing Quantum Bits. Phys Rev Lett. Sep. 8, 1997;79(10-8):1953-6.
Eichler et al., Controlling the dynamic range of a Josephson parametric amplifier. EPJ Quantum Tech. Jan. 29, 2014;1(2). doi:10.1140/epjqt2. 19 pages.
Facchi et al., Quantum Zeno Subspaces. Phys Rev Lett. Aug. 19, 2002;89(8):080401.1-4.
Heeres et al., Cavity State Manipulation Using Photon-Number Selective Phase Gates. Phys Rev Lett. Sep. 25, 2015;115:137002. 1-5. doi: 10.1103/PhysRevLett.115.137002.
Hofheinz et al., Synthesizing arbitrary quantum states in a superconducting resonator. Nature. May 28, 2009;459:546-9. doi:10.1038/nature08005. Supplementary Information. 5 pages.
Hover et al., High fidelity qubit readout with the superconducting lowinductance undulatory galvanometer microwave amplifier. Appl Phys Lett. 2014;104;152601.1-4.
Hover et al., Superconducting Low-inductance Undulatory Galvanometer Microwave Amplifier. Appl Phys Lett. Feb. 7, 2012;100:063503.1-3.
Johnson et al., Dispersive readout of a flux qubit at the single-photon level. Phys Rev B. 2011;84:220503. arXiv:1109.2858v2. 5 pages.
Kamal et al., Gain, directionality, and noise in microwave SQUID amplifiers: Input-output approach. Phys Rev B. 2012;86:144510.1-12. doi: 10.1103/PhysRevB.86.144510.
Kerckhoff et al., On-chip superconducting microwave circulator from synthetic rotation. Phys Rev Appl. 2015;4:034002. arXiv:1502.06041. Submitted Feb. 21, 2015. 13 pages.
Kirchmair et al., Observation of quantum state collapse and revival due to the single-photon Kerr effect. Nature. Mar. 14, 2013;495:205-9. doi:10.1038/nature11902.
Knill et al., Theory of Quantum Error Correction for General Noise. Phys Rev Lett. Mar. 13, 2000;84(11):2525-8. arXiv:quant-ph/9908066v1. 6 pages.
Krastanov et al., Universal Control of an Oscillator with Dispersive Coupling to a Qubit. Phys Rev A. 2015;92:040303. arXiv:1502.08015. Submitted Feb. 27, 2015. 5 pages.
Leghtas et al., Confining the state of light to a quantum manifold by engineered two-photon loss. Dec. 16, 2014. arXiv:1412.4633v1. 29 pages.
Lidar et al., Decoherence-Free Subspaces for Quantum Computation. Phys Rev Lett. Sep. 21, 1998;81(12):2594-7. arXiv:quant-ph/9807004v2. 4 pages.
Lindblad, On the generators of quantum dynamical semigroups. Commun Math Phys. 1976;48(2):119-30.
Minev et al., Planar Superconducting Whispering Gallery Mode Resonators. Appl Phys Lett. Oct. 3, 2013;103:142604.1-3. doi:10.1063/1.4824201.
Mirrahimi et al., Dynamically protected cat-qubits: a new paradigm for universal quantum computation. New J Phys. Apr. 22, 2014;16:045014. 31 pages.
Mousolou et al., Universal non-adiabatic holonomic gates in quantum dots and single-molecule magnets. New J Phys. Jan. 17, 2014;16:013029. 10 pages.
Mück et al., Superconducting Quantum Interference Device as a Near-Quantum-Limited Amplifier at 0.5 GHz. Appl Phys Lett. Feb. 12, 2001;78(7):967-9. doi: 10.1063/1.1347384.
Narla et al., Wireless Josephson amplifier. Appl Phys Lett. 2014;104:232605. doi: 10.1063/1.4883373. 6 pages.
O'Brien et al., Resonant Phase Matching of Josephson Junction Traveling Wave Parametric Amplifiers. Phys Rev Lett. Oct. 10, 2014;113:157001.1-5.
Oreshkov et al., Adiabatic Markovian Dynamics. Phys Rev Lett. Jul. 30, 2010;105(5):050503. arXiv:1002.2219v4. 7 pages.
Oreshkov et al., Fault-Tolerant Holonomic Quantum Computation. Phys Rev Lett. Feb. 20, 2009;102:070502.1-4.
Oreshkov, Holonomic Quantum Computation in Subsystems. Phys Rev Lett. Aug. 28, 2009;103(9):090502. arXiv:0905.1249v3. 5 pages.
Pachos et al., Decoherence-free dynamical and geometrical entangling phase gates. Phys Rev A. 2004;69:033817. arXiv:quant-ph/0309180v3. 10 pages.
Paik et al., Observation of High Coherence in Josephson Junction Qubits Measured in a Three-Dimensional Circuit QED Architecture. Phys Rev Lett. 2011 Dec. 5, 2011;107(24):240501. arXiv:1105.4652v4. 5 pages.
Paz-Silva et al., Zeno Effect for Quantum Computation and Control. Phys Rev Lett. Feb. 24, 2012;108(8):080501. arXiv:1104.5507v2. 7 pages.
Pillet et al., Optimal design for the Josephson mixer. Mar. 30, 2015 arXiv:1503.08185v1. 5 pages.
Ranzani et al., Graph-based analysis of nonreciprocity in coupled-mode systems. New J Phys. Oct. 15, 2014;17:023024. arXiv 2014;1406.4922v2. 21 pages.
Ristè et al., Feedback Control of a Solid-State Qubit Using High-Fidelity Projective Measurement. Phys Rev Lett. Dec. 2012;109(24):240502. arXiv:1207.2944v1 [cond-mat.mes-hall]. 9 pages.
Roch et al., Observation of measurement-induced entanglement and quantum trajectories of remote superconducting qubits. Phys Rev Lett. May 2, 2014;112:170501.1-5.
Roch et al., Widely Tunable, Nondegenerate Three-Wave Mixing Microwave Device Operating near the Quantum Limit. Phys Rev Lett. Apr. 2012;108(14):147701. arXiv:1202.1315v1 [cond-mat.mes-hall]. 5 pages.
Sarandy et al., Abelian and non-Abelian geometric phases in adiabatic open quantum systems. Phys Rev A. Jun. 2006;73(6):062101. arXiv:quant-ph/0507012v3. 10 pages.
Schackert et al., Phase-preserving amplification near the quantum limit with a Josephson ring modulator. Nature. May 2010;465(7294):64-8. arXiv:0912.3407v1. 20 pages.
Schindler et al., Quantum simulation of dynamical maps with trapped ions. Nature Phys. May 19, 2013;9:361-7. arXiv:1212.2418v1. 28 pages.
Schoelkopf, Error-Corrected Quantum Registers for a Modular Superconducting Quantum Computer. Yale White Paper for ARO/LPS. Department of Applied Physics and Physics. Jan. 7, 2013. 53 pages.
Siddiqi et al., An RF-Driven Josephson Bifurcation Amplifier for Quantum Measurement. Phys Rev Lett. Nov. 10, 2004;93:207002. arXiv:cond-mat/0312623v1. 4 pages.
Sjöqvist, Trends: A new phase in quantum computation. Phys. 2008;1:35. doi: 10.1103/Physics.1.35. 6 pages.
Spietz et al., Input Impedance and Gain of a Gigahertz Amplifier Using a dc Superconducting Quantum Interference Device in a Quarter Wave Resonator. Appl Phys Lett. 2008;93:082506. arXiv:0806.2853v1. 4 pages.
Vijay et al., Observation of Quantum Jumps in a Superconducting Artificial Atom. Phys Rev Lett. Mar. 18, 2011;106(11):110502.1-4.
Wu et al., Time-dependent decoherence-free subspace. J Phys A: Math. Theor. Sep. 19, 2012;45(40):405305. arXiv:1205.1298v2. 7 pages.
Xu et al., Non-Adiabatic Holonomic Quantum Computation in Decoherence-Free Subspaces. Phys Rev Lett. Oct. 24, 2012;109(17):170501. arXiv:1210.6782v1. 4 pages.
Xu et al., Universal Nonadiabatic Geometric Gates in Two-Qubit Decoherence-Free Subspaces. Sci Rep. Oct. 29, 2014;4:6814. doi: 10.1038/srep06814. 5 pages.
Yaakobi et al., Parametric amplification in Josephson junction embedded transmission lines. Phys Rev B. Apr. 1, 2013;87:144301. 1-9. doi: 10.1103/PhysRevB.87.144301.
Zanardi et al., Coherent quantum dynamics in steady-state manifolds of strongly dissipative systems. Phys Rev Lett. Dec. 17, 2014;113:240406. arXiv:1404.4673. 6 pages.
Zanardi et al., Geometry, robustness, and emerging unitarity in dissipation-projected dynamics. Phys Rev A. 2015;91:052324. arXiv:1412.6198. 8 pages.
Zanardi et al., Holonomic Quantum Computation. Phys Lett A. Nov. 1999 15;264:94-9. 5 pages.

(56) References Cited

OTHER PUBLICATIONS

Zanardi et al., Noiseless Quantum Codes. Phys Rev Lett. Oct. 27, 1997;79(17):3306-9. arXiv:quant-ph/9705044v2. 4 pages.
Zanardi, Stabilizing Quantum Information. Phys Rev A. Dec. 5, 2000;63(1):012301. arXiv:quant-ph/9910016v2. 5 pages.
Zanardi, Virtual Quantum Subsystems. Phys Rev Lett. Aug. 13, 2001;87(7):077901. arXiv:quant-ph/0103030v2. 4 pages.
Zhang et al., Physical implementation of holonomic quantum computation in decoherence-free subspaces with trapped ions. Phys Rev A. 2006;74:034302. arXiv:quant-ph/0608068v1. 4 pages.
Zheng, Dissipation-induced geometric phase for an atom in captivity QED. Phys Rev A. May 10, 2012;85(5):052106. arXiv:1205.0984v2. 7 pages.
Zheng, Open-system geometric phase based on system-reservoir joint state evolution. Phys Rev A. Jun. 27, 2014;89:062118. arXiv:1405.1227v1. 8 pages.
Zhu et al., Geometric quantum gates robust against stochastic control errors. Phys Rev A. Aug. 15, 2005;72(2):020301. arXiv:quant-ph/0407177v1. 4 pages.

\* cited by examiner

WIRELESS JOSEPHSON BIFURCATION AMPLIFIER

RELATED APPLICATIONS

This application claims the benefit of U.S. provisional Application Ser. No. 61/943,150, titled "Wireless Josephson Bifurcation Amplifier," filed on Feb. 21, 2014, the entire disclosure of which is incorporated herein by reference.

GOVERNMENT FUNDING

This invention was made with government support under Grant Nos. ARO W911NF-0911-0514 and ARO W911NF-0911-0369, and ARO W911NF-14-1-0010 awarded by Army Research Office and under Grant Nos. DMR-1006060 and No. DMR-0653377 awarded by the National Science Foundation. The government has certain rights in the invention.

DISCUSSION OF RELATED ART

Quantum information processing uses quantum mechanical phenomena, such as energy quantization, superposition, and entanglement, to encode and process information in a way not utilized by conventional information processing. For example, it is known that certain computational problems may be solved more efficiently using quantum computation rather than conventional classical computation. However, to become a viable computational option, quantum computation requires the ability to precisely control a large number of quantum bits, known as "qubits," and the interactions between these qubits. In particular, qubits should have long coherence times, be able to be individually manipulated, be able to interact with one or more other qubits to implement multi-qubit gates, be able to be initialized and measured efficiently, and be scalable to large numbers of qubits.

A qubit may be formed from any physical quantum mechanical system with at least two orthogonal states. The two states of the system used to encode information are referred to as the "computational basis." For example, photon polarization, electron spin, and nuclear spin are two-level systems that may encode information and may therefore be used as a qubit for quantum information processing. Different physical implementations of qubits have different advantages and disadvantages. For example, photon polarization benefits from long coherence times and simple single qubit manipulation, but suffers from the inability to create simple multi-qubit gates.

Different types of superconducting qubits using Josephson junctions have been proposed, including "phase qubits," where the computational basis is the quantized energy states of Cooper pairs in a Josephson Junction; "flux qubits," where the computational basis is the direction of circulating current flow in a superconducting loop; and "charge qubits," where the computational basis is the presence or absence of a Cooper pair on a superconducting island. Superconducting qubits are an advantageous choice of qubit because the coupling between two qubits is strong making two-qubit gates relatively simple to implement.

Many quantum information processing systems utilize Josephson-junction-based amplifiers for detection and processing of qubits. Conventional Josephson-junction amplifiers may be built from a superconducting integrated circuit containing Josephson junctions, which are the active elements. The integrated circuit may need to be wire bonded to a printed circuit board, itself connected electrically to microwave sub-miniature adapter (SMA) connectors in a sample box, so that signals can be transmitted from a detector and amplifier (which may be at cryogenic temperatures) to processing electronics (which may be at room temperatures). Additional elements may also need to be added to the box (e.g., hybrid couplers).

Integration of Josephson amplifiers into current quantum electrodynamics (QED) systems may be challenging, because of the need for interconnects that transition between waveguide, coaxial, and microstrip microwave environments. Additionally, these amplifiers may require ancillary microwave components like directional couplers and hybrids to operate. As a result, potentially undesirable consequences may arise. For example, these microwave components and transitions can introduce losses that reduce the system measurement efficiency and thus the fidelity of qubit readout. Also, the components and transitions may result in a complicated frequency dependence of impedances seen by an amplifier, which limits the amplifier's tunability and performance.

SUMMARY

Embodiments comprise a novel Josephson-junction-based circuit that amplifies microwave signals without the need for physical electrical connections (e.g., wires or wire bonds) between an integrated superconducting circuit containing Josephson junctions and a surrounding microwave environment. Interaction of the amplifier with the microwave environment is achieved wirelessly by one or more micro-antennas integrated onto a chip and by careful placement of the microwave integrated circuit directly into a microwave waveguide. The resulting wireless amplifier has not only the gain and bandwidth performance of conventional Josephson amplifiers based on similar junctions, but it is potentially advantageous in terms of its dynamic range, tunability, and efficiency.

Embodiments address the problem of constructing a Josephson amplifier with a reduced number of parts. According to some embodiments, solutions to this problem may satisfy one or more of the following criteria: 1) an amplifier that should be as easy and as reliable to build as possible (since quantum information processing systems use many of these amplifiers, probably hundreds per system), 2) an amplifier that should be as efficient as possible, meaning that few or no microwave photons are lost in the process of amplification (such loss may lead to a degradation of the noise performance of the readout chain containing the amplifier), and 3) an amplifier that should have as large a dynamic range as possible. Satisfying this last criterion means that a wireless amplifier should be able to process as many microwave photons as possible without saturating.

According to some embodiments, a wireless amplifier comprises at least one Josephson junction fabricated on a substrate and at least one radio-frequency antenna connected to the at least one Josephson junction. In some implementations, the at least one Josephson junction is formed on the substrate as a superconducting quantum interference device (SQUID). In some aspects, the at least one radio-frequency antenna comprises at least one dipole antenna formed on the substrate. A length of one dipole antenna may be between about 1 mm and about 5 mm. According to some implementations, the at least one radio-frequency antenna is configured to apply a signal differentially across the superconducting quantum interference device. According to some aspects, a wireless amplifier may further comprise a split capacitor connected in parallel with the at least one Josephson junction. The split capacitor may comprise a pair of parallel-plate capacitors formed on the substrate. In some aspects, the wireless amplifier may have a Qp product comprising a resonator Q and inductance participation ratio p, wherein the Qp product is between about 5 and about 10. In some implementations, at least a portion of the split capacitor and a portion of the at least one Josephson junction are formed from a same layer of conductive material. According to some implementations, the at least one radio-frequency antenna comprises a portion of the same layer of conductive material.

In some aspects, the at least one radio-frequency antenna may be connected in series with the at least one Josephson junction. According to some implementations, a wireless amplifier may further comprise a microwave waveguide, wherein the substrate is mounted within the microwave waveguide. The at least one antenna may be located a distance d from a terminating end of the microwave waveguide, wherein $n\lambda_g/2 < d < (n+1)\lambda_g/2$ where n is an integer and $\lambda_g$ represents a fundamental wavelength supported by the waveguide.

In some implementations, a wireless amplifier may further comprise a signal port connected to the waveguide for applying a signal to be amplified and a pump port connected to the waveguide for applying at least one pump signal.

The foregoing aspects, features, and implementations associated with a wireless amplifier may be included in any suitable combination in one or more embodiments of a wireless amplifier. Additionally, any of the foregoing embodiments of a wireless amplifier may be fabricated and/or operated according to method embodiments described below.

In some embodiments, a method for amplifying signals with a wireless amplifier may comprise acts of receiving a signal from a first radio-frequency antenna that is connected to at least one Josephson junction, receiving two pump signals from a second radio-frequency antenna, and mixing the received signal and two pump signals using a resonator comprising the at least one Josephson junction.

In some implementations, a method for amplifying signals may further comprise radiating an amplified signal of the received signal using the first radio-frequency antenna. In some aspects, the resonator comprises a superconducting quantum interference device formed by the at least one Josephson junction and a split capacitor connected in parallel with the superconducting quantum interference device. According to some implementations, the amplifier has a Qp product comprising a resonator Q and inductance participation ratio p, wherein the Qp product is between about 5 and about 10.

According to some aspects, the mixing comprises four-wave mixing. The first radio-frequency antenna may be located a distance d from a terminating end of a microwave waveguide, wherein $n\lambda_g/2 < d < (n+1)\lambda_g/2$ where n is an integer and $\lambda_g$ represents a fundamental wavelength supported by the waveguide. In some aspects, the first radio-frequency antenna and the at least one Josephson junction are formed on a same substrate. A length of the first radio-frequency antenna may be between about 1 mm and about 5 mm. The foregoing aspects, features, and implementations relating to acts for amplifying signals with a wireless amplifier may be used in any suitable combination in one or more embodiments of methods for amplifying signals with a wireless amplifier.

According to some embodiments, a method for fabricating a wireless amplifier may comprise acts of forming at least one Josephson junction on a substrate, and forming at least one radio-frequency antenna connected to the at least one Josephson junction.

In some implementations, forming the at least one Josephson junction comprises depositing a conductive layer on an insulator on the substrate to form a portion of the Josephson junction. In some aspects, depositing the conductive layer is part of a double-angle evaporation process. According to some implementations, depositing the conductive layer forms at least a portion of the at least one radio-frequency antenna.

According to some implementations, forming the at least one Josephson junction may comprise forming a superconducting quantum interference device. In some aspects, a method for fabricating a wireless amplifier may further comprise forming at least one capacitor connected in parallel with the superconducting quantum interference device. According to some implementations, depositing the conductive layer forms at least a portion of the at least one capacitor.

In some aspects, a method for fabricating a wireless amplifier may further comprise mounting the substrate in a microwave waveguide. A method may further include locating a first antenna of the at least one antenna in the microwave waveguide a distance d from a terminating end of the microwave waveguide, wherein $n\lambda_g/2 < d < (n+1)\lambda_g/2$ where n is an integer and $\lambda_g$ represents a fundamental wavelength supported by the waveguide. In some aspects, a length of the first antenna of the at least one antenna is between about 1 mm and about 5 mm.

The foregoing and other aspects, implementations, embodiments, and features of the present teachings can be more fully understood from the following description in conjunction with the accompanying drawings.

BRIEF DESCRIPTION OF THE DRAWINGS

The skilled artisan will understand that the figures, described herein, are for illustration purposes only. It is to be understood that in some instances various aspects of the embodiments may be shown exaggerated or enlarged to facilitate an understanding of the embodiments. In the drawings, like reference characters generally refer to like features, functionally similar and/or structurally similar elements throughout the various figures. The drawings are not necessarily to scale, emphasis instead being placed upon illustrating the principles of the teachings. Where the drawings relate to microfabrication of integrated devices, only one device may be shown of a large plurality of devices that may be fabricated in parallel. Directional references (top, bottom, above, below, etc.) made to the drawings are merely intended as an aid to the reader. A device may be oriented in any suitable manner in embodiments. The drawings are not intended to limit the scope of the present teachings in any way.

The features and advantages of the embodiments will become more apparent from the detailed description set forth below when taken in conjunction with the drawings.

DETAILED DESCRIPTION

Parametric amplifiers (paramps) based on Josephson junctions, such as the Josephson bifurcation amplifier (JBA) and the Josephson parametric converter (JPC), can play important roles in the quantum non-demolition (QND) readout chain of superconducting qubits. For example, they have been used in systems to observe quantum jumps, and in the detailed study of measurement backaction and feedback. It is likely that paramps will continue to be used in future systems involving quantum error correction and other quantum information processing applications. As noted above, integration of Josephson-junction-based amplifiers into current state-of-the-art 3D Circuit QED (CQED) systems using conventional techniques can be difficult, because of issues related to transitions between waveguide, coaxial, printed circuit board, and microstrip microwave environments and often-needed ancillary microwave components.

The inventors have recognized and appreciated that, in some embodiments, the printed circuit intermediary and hybrid couplers may be eliminated from QED circuits. For example, an integrated circuit chip having at least one integrated antenna may be mounted directly in a microwave waveguide which is equipped with a transition to a sub-miniature adapter (SMA) type connector. The chip may incorporate one or more radio-frequency (RF) antennas of an adequate length to provide a correct coupling to the relevant propagating mode of the waveguide. The chip may further include elements of a superconducting integrated circuit, so that energy can be coupled wirelessly between the waveguide and superconducting integrated circuit. Additionally, pump signals that provides power for amplification may also be wirelessly coupled to the chip via another small antenna, e.g., by extending a coax cable of a pump line into the waveguide.

The simplification in the microwave environment by using a wireless architecture may reduce or eliminate sources of loss that currently limit the measurement efficiency of circuit QED systems. In some embodiments, features for wireless coupling and amplification are readily manufacturable, so that the amplifier may be mass produced at reasonable cost. The design and reduced number of parts, whose individual quality can be separately controlled before final assembly, can make the device more reliable and less susceptible to spurious dissipation that can lead to reduced efficiency. Additionally, the flexibility gained by this new design at the chip level enables tunability of the amplifier's dynamic range.

Figure 1A:
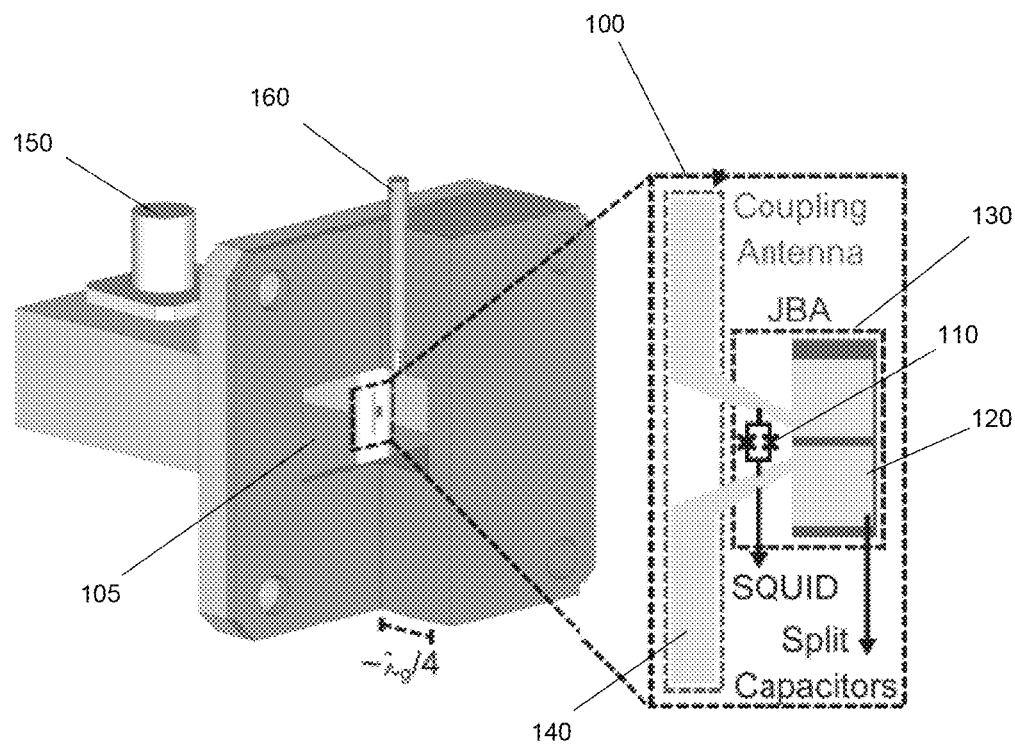
FIG. 1A depicts a wireless Josephson bifurcation amplifier (WJBA), according to some embodiments.

According to some embodiments, a lumped element JBA circuit is coupled directly and wirelessly to a rectangular waveguide using an antenna, as depicted in FIG. 1A. Some designs may use low-loss, high quality materials common to applications involving superconducting qubits, and may eliminate several of the ancillary microwave components and interconnects as well as printed circuit (PC) boards and wirebonds. Removal of some of these components may simplify the impedance seen by the amplifier, making it flatter as a function of frequency. A more uniform impedance can lead to larger amplifier bandwidth and/or tunability. Additionally, control of the circuit's coupling and quality factor, Q, and the amplifier's dynamic range may be improved, while maintaining gain, bandwidth, and noise performance commensurate with conventional parametric amplifiers. The wireless JBA (WJBA) may be suitable for integration into 3D CQED systems, e.g., incorporation into a readout chain. Further, the wireless architecture could be extended to realize a wireless JPC (WJPC), e.g., by adding an antenna to a lumped JPC circuit and placing it at the intersection of two waveguides with perpendicular polarizations.

In some implementations, a WJBA 100, comprises a lumped element resonator 130 made of a superconducting quantum interference device (SQUID) 110, acting as an external flux-tunable inductance $L_J(\Phi)$, shunted by a split parallel-plate capacitor 120 with capacitance C. The value of capacitance may be selected based upon a desired operating frequency, and may have a value in a range between about 0.5 pF and about 30 pF, according to some embodiments. Smaller or larger values may be used in some implementations. The tunable inductance may be determined by the following expression: $L_J(\Phi)=\Phi_0/2\pi I_0 \cos(\pi\Phi/\Phi_0)$, where $I_0$ is the SQUID critical current, $\Phi$ is an externally applied magnetic flux and $\Phi_0$ is the magnetic flux quantum. According to some embodiments, the SQUID loop may be microfabrication and have transverse dimensions between about 1 μm and about 10 μm. In some implementations, a SQUID loop may measure approximately 8 μm×2 μm. The critical current $I_0$ may have a value between about 2 μA and about 50 μA in some embodiments, though may be greater than this value in some implementations.

A WJBA may further include at least one antenna 140 that is connected to the lumped resonator and configured to couple energy from the resonator to propagating electromagnetic waves in the rectangular waveguide 105. The waveguide may be designed with an impedance-matched transition to a connection (e.g., to a 50-ohm coax cable or connector). An antenna 140 may be formed as a dipole antenna on the same substrate as the lumped resonator 130, and may be configured to apply a received signal differentially across the SQUID 110 and split capacitor 120. Other antenna structures (e.g., plate, disc, bowtie, or loop antenna structures) may be used in other embodiments. An antenna may have a length or transverse dimension between about 1 mm and about 5 mm. In some aspects, the waveguide 105 comprises a waveguide-to-coaxial-cable adapter (e.g., model WR-90 available from Fairview Microwave Inc. of Allen, Tex.). The WR-90 may have inner dimensions of 0.90 inches by 0.40 inches that allows the WJBA to operate between about 8.2 and about 12.4 GHz, according to some embodiments. In some implementations, other dimensions and frequency ranges may be used. In some embodiments, connection to a WJBA may be entirely made using only waveguide components, leading to a simplified assembly of components in CQED circuits.

In embodiments, the lumped resonator and dipole antenna 140 may be fabricated on a planar substrate or chip. For example, the substrate may comprise a planar sapphire layer, though other substrate materials (e.g., semiconductor or insulator-on-semiconductor, quartz, diamond, fused silica, etc.) may be used in some implementations. The chip may be mounted at a distance of approximately $\lambda_g/4$ away from a wall or end (effectively a shorted termination) of the waveguide 105, thus situating it at an electric field anti-node to maximize or increase coupling between the lumped resonator and electromagnetic wave in the waveguide. $\lambda_g$ represents a fundamental wavelength of an electromagnetic wave supported by the waveguide. According to some embodiments, an antenna 140 of a WJBA may be located a distance d from a terminating end of the microwave waveguide, wherein $n\lambda_g/2 < d < (n+1)\lambda_g/2$ where n is an integer.

In operation and in some implementations, signals to be amplified at frequency $\omega_s$ may enter the device through a waveguide-to-SMA adapter 150. The adapter 150 may be used to make the device compatible with existing system setups. In some implementations, the waveguide may couple to other devices at a different location along the waveguide and the adapter 150 may not be needed. Signals at $\omega_s$ may travel down the waveguide and excite a differential signal across the lumped resonator 130. Pump energy tones at $\omega_{p1}$ and $\omega_{p2}$ required for amplification enter through a weakly-coupled pump port 160. Introducing pump energy through the weakly-coupled port 160 can reduce or eliminate the need for a directional coupler, in some implementations. Four-wave mixing in the non-linear resonator may then occur and result in the signals at $\omega_s$ being amplified and re-radiated by the coupling antenna 140. The pump tones may also be coupled into the waveguide, with the short ensuring that all signals exit the device through the waveguide port 150.

Figure 1B:
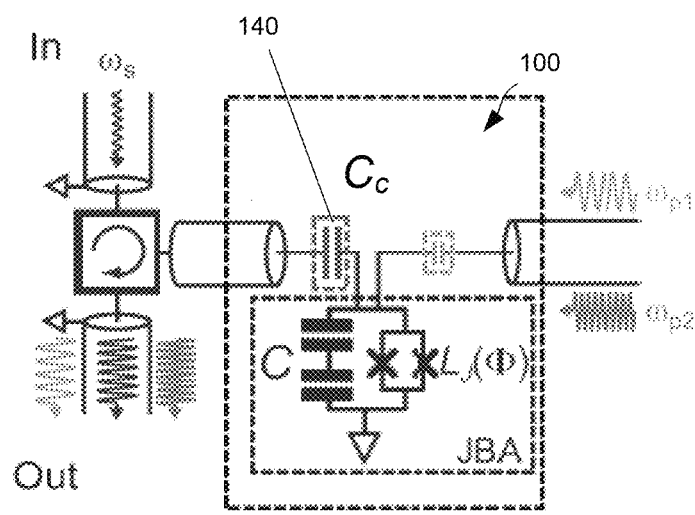
FIG. 1B depicts a circuit schematic for a WJBA, according to some implementations.

For purposes of understanding and without being bound to any particular theory, a WJBA may be represented by the circuit schematic depicted in FIG. 1B, according to some embodiments. The inventors have recognized and appreciated that the added antenna 140 in a WJBA behaves like a coupling capacitor ($C_c$) between the lumped resonator 130 and the waveguide 105. As a result, unlike the conventional JBA, the resonator bandwidth of a WJBA can be engineered independently of the resonator frequency. The coupling Q of the resonator 130 may be given by:

$$Q = \frac{Z_c}{Z_0}\left(\frac{C}{C_c}\right)^2 \quad (1)$$

where $Z_0$ is the impedance of the environment, $Z_c = \sqrt{(L_J + L_{stray})/C}$ is the characteristic impedance of the resonator 130, $L_J$ is the SQUID inductance, $L_{stray}$ is the stray inductance in the circuit, C is the resonator capacitance and $C_c$ is the coupling capacitance due to the dipole antenna. The resonator Q may be tuned by changing $C_c$, which in turn may be proportional to a length of a dipole antenna, L, according to some embodiments.

Another figure of merit for parametric amplifiers is the inductance participation ratio, $p = L_J/(L_J + L_{stray})$. Together, Q and p, sometimes referred to as the resonator's Qp-product, may determine both whether the resonator will amplify and a maximum signal power that can be amplified without saturation. To realize an amplifier with sufficient gain for qubit readout, it is necessary that Qp>5. However, to increase the amplifier saturation power, the Qp-product needs to be as low as possible. According to some embodiments, the Qp-product may be in a range between 5 and about 10 for improved saturation performance. With these new degrees of freedom, it is possible to increase the amplifier dynamic range. For example, the dynamic range may be increased by decreasing the Qp product with a WJBA comprising multiple SQUIDs in series with correspondingly large critical current junctions.

Wireless JBA chips may be fabricated using planar microfabrication techniques, according to some embodiments. For example, planar techniques may be used to fabricate both parallel-plate capacitors and a Josephson junction on chip. In some implementations, a three-layer fabrication process may be employed that avoids patterning vias. Such a three-layer process may be as described in M. Hatridge et al., "Dispersive magnetometry with a quantum limited SQUID parametric amplifier," *Phys. Rev. B, Vol.* 83, p. 134501 (2011), which is incorporated herein be reference. In some implementations, a Josephson junctions and/or split capacitor may be fabricated from a three-layer stack comprising Al/AlO$_x$/Al or Nb/Al/AlO$_x$/Nb, for example. In some cases, a junction may be formed from a conductive nano-bridge comprising Nb, Al, or other suitable conductor.

Figure 2A:
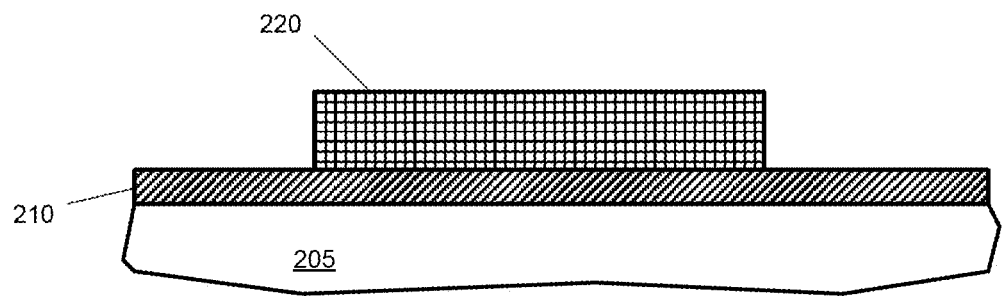
FIG. 2A through FIG. 2E depict structures associated with process steps for fabricating a WJBA, according to some embodiments.
Figure 2B:
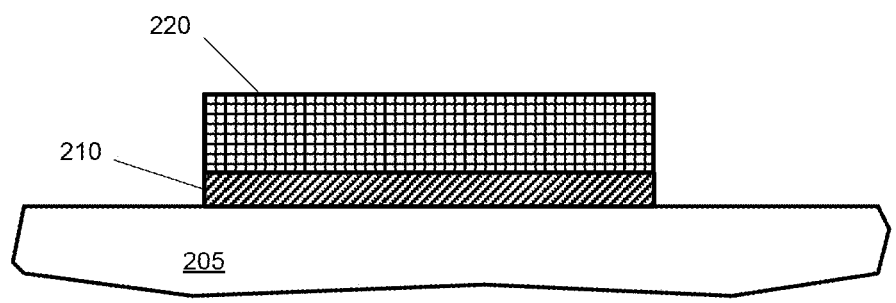

According to some embodiments, a conductive layer 210 may be deposited on a substrate 205, and a resist 220 patterned over the layer using optical lithography, for example, as depicted in FIG. 2A. The thickness of the conductive layer may be between about 20 nm and about 300 nm, and any suitable conductive material or combination of conductive materials may be used (e.g., one or more of the following materials: niobium, aluminum, titaniun nitdride, niobium titanium nitride, rhenium). In some implementations, the conductive layer may be thicker than 300 nm. According to some embodiments, the conductive layer 210 may comprise a layer of niobium that is about 150 nm thick. The resist 220 may be a hard (e.g., inorganic) resist or soft (e.g., polymeric) resist. The conductive layer may then be patterned using an etching process (e.g., reactive-ion etching) to define a shared ground plane of the split parallel-plate capacitors 120, as depicted in FIG. 2B. The resist may then be stripped from the substrate.

Figure 2C:
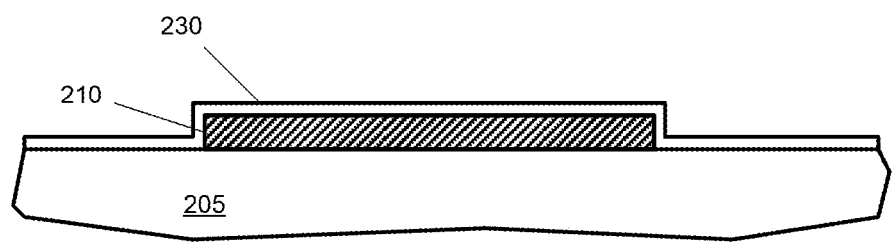

Next, an insulating layer 230 may be deposited conformally over the substrate using any suitable deposition process (e.g., chemical vapor deposition, plasma-enhanced chemical vapor deposition), as depicted in FIG. 2C. The insulating layer may form a dielectric layer of the split capacitors 120. Any suitable dielectric may be used (e.g., an oxide, a nitride). The capacitance may be determined by selection of the capacitors' areas, thickness of the insulating layer, and permittivity of the insulator. As an example, the insulating layer 230 may comprise silicon nitride that is about 200 nm thick, and the capacitor areas may be sized to create capacitors having about 3.5 pF capacitance.

Figure 2D:
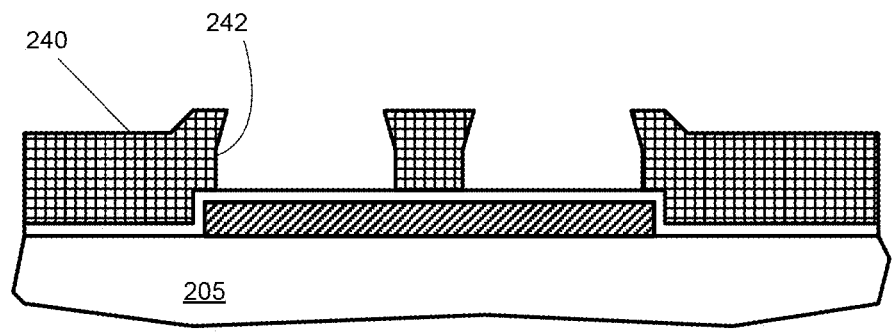

A second resist 240 may be formed on the substrate and patterned using any suitable patterning process to define shapes for the separated plates of the split capacitors as well as features of a SQUID (not shown). According to some embodiments, the second resist may comprise a bi-layer resist of MMA-PMMA, and electron-beam lithography, for example, may be used to pattern the resist. In some implementations, photoresist and photolithography may be used. The patterned resist 240 may appear (in elevation view) as depicted in FIG. 2D, and exhibit an undercut profile 242.

The undercut profile may be formed using a bi-layer resist, and is suitable for a subsequent physical deposition of a layer using a double-angle evaporation process.

Figure 2E:
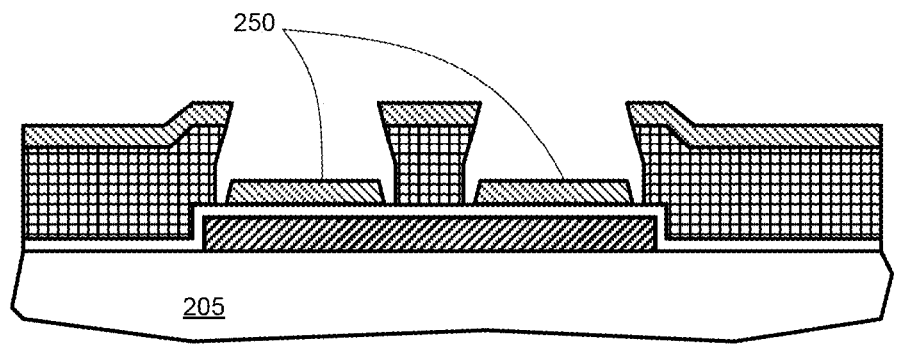

In some implementations, a physical deposition of a second conductor may be used to form the separated plates 250 of the split capacitors, as depicted in FIG. 2E. The second conductor remaining above the resist may be removed by a lift-off process in some implementations, or may be left on the substrate in other implementations. In some implementations, an angled evaporation of aluminum may be used to define the plates of the capacitors, and the angled evaporation may be part of a double-angle evaporation that is used to form at least part of the Josephson junctions on the same substrate.

In some embodiments, the same deposition processes may be used to form at least a portion of each of the split capacitors, Josephson junctions of a SQUID loop, and the coupling antenna 140 of the device. For example, a same layer may be deposited in one step to form at least part of the split capacitor 120, SQUID 110, and antenna 140. For example, an upper or lower conductive layer of one or more Josephson junctions, an upper or lower plate of the split capacitor 120, and the antenna 140 may be formed at a same time, on the same substrate, and using a same deposition process. Accordingly, the relevant features of each component may include the same material compositions.

Although the fabrication of one integrated split capacitor, antenna, and SQUID is described above, tens, hundreds, or thousands of these devices may be fabricated in parallel on a same substrate using microfabrication techniques.

Numerical simulations were carried out to study operational characteristics of a WJBA. According to some embodiments, a WJBA may be modeled using a finite-element electromagnetic solver, such as a high frequency structural simulator (HFSS) available from Ansys, Inc. of Cecil Township, Pa. To evaluate an amplifier designed for qubit readout, circuit parameters were chosen such that the SQUID critical current was about $I_0$=4 µA and capacitance of the split capacitors was about C=3.5 pF. These values set an upper linear resonance frequency to be around 9.5 GHz. To make the amplifier's bandwidth larger than a typical qubit cavity bandwidth, a value of Q≈100 was chosen. This value required two dipole antennas that were each about 2.5 mm long and about 0.25 mm wide, separated by about 150 µm. In some implementations, a dipole antenna may be between about 1 mm long and about 5 mm long. These sizes and associated structures can be readily fabricated using either optical or electron-beam lithography techniques.

Figure 3A:
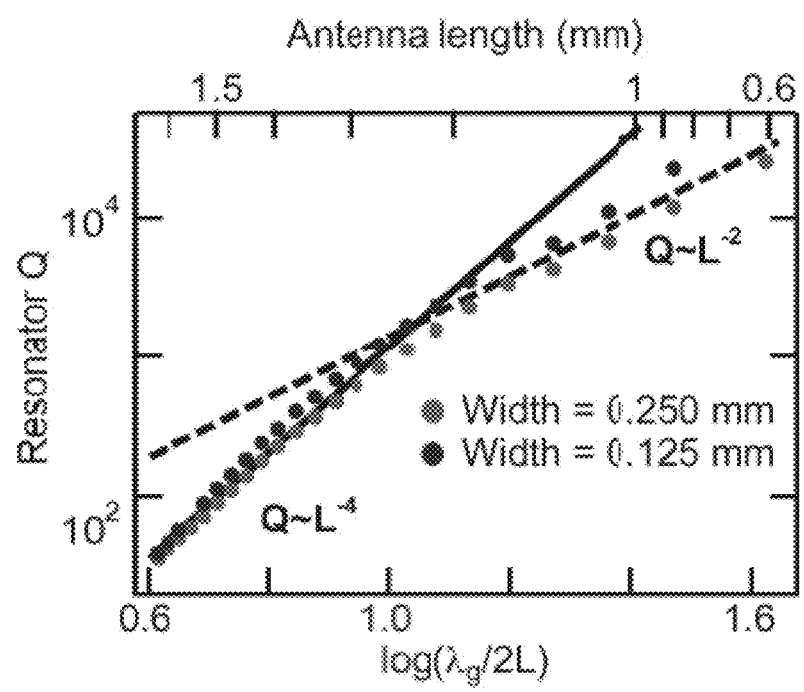
FIG. 3A illustrates variation in a Q value of a WJBA resonator as a function of length of a dipole antenna, according to some embodiments.

Although Q≈100 was chosen for the simulation, because $C_c \propto L$, by changing the length of the antenna alone, the Q value can be tuned by over three orders of magnitude as indicated in FIG. 3A. These simulations confirmed that the $Q \propto L^{-2}$ behavior indicated by Eqn. 1 holds for short antenna lengths but breaks down for longer antenna lengths when the size of the dipole antenna becomes comparable to the size of the waveguide. Nevertheless, the value Q can be simulated and tuned over three orders of magnitude by changing the length of the antenna. Changing the antenna width only leads to small changes in Q.

Figure 3B:
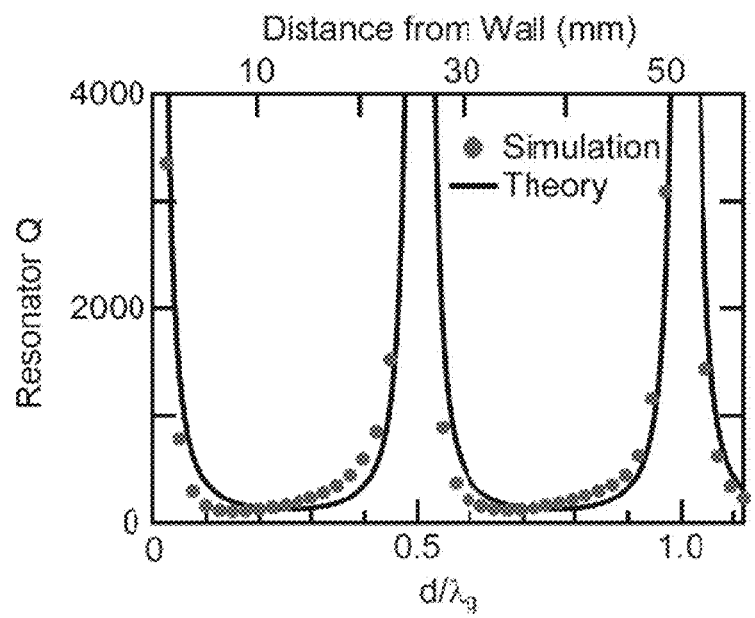
FIG. 3B illustrates variation in Q of a WJBA as a function of location of a dipole antenna within a waveguide, according to some embodiments.

The behavior of the resonator's linear Q factor as a function of the distance, d, from the wall or termination of the waveguide 105 was also simulated. For increased coupling between the lumped resonator 130 and waveguide, the chip is located at an antinode of the electric field in the waveguide. Reduced coupling occurs when the chip is located at a node. FIG. 3B shows results from the simulations that indicates the dependence of Q on distance d. For example, Q reduces in value (increases coupling) when $d=n\lambda_g/2$ where n is an integer and $\lambda_g$ is the guide wavelength. Moreover, because the coupling is relatively flat around $d=(2n+1)\lambda_g/4$, the design is robust against errors in fabrication or machining that might affect the resonator frequency or its position from the wall.

EXAMPLES

Figure 4A:
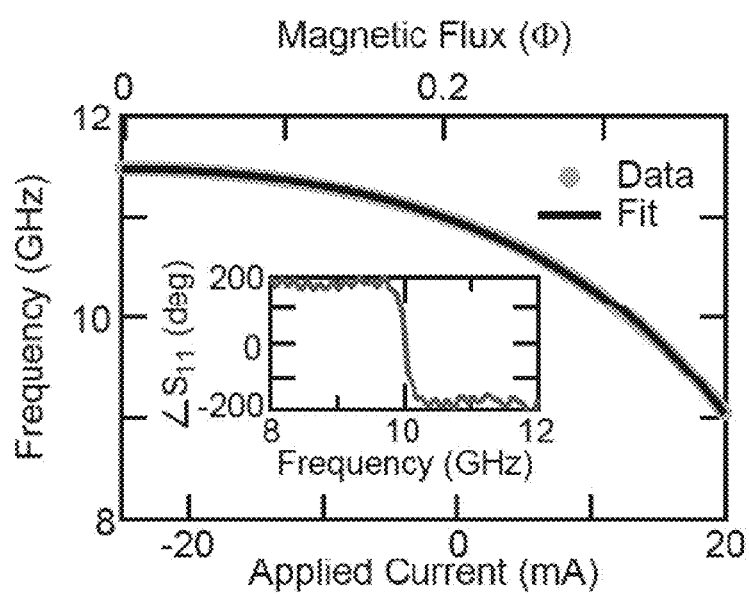
FIG. 4A illustrates phase dependence on frequency (inset) and frequency dependence on magnetic flux for a fabricated WJBA, according to some embodiments.

Wireless JBAs were fabricated using methods described above, and tested. In some cases, WJBAs were cooled down in a cryogen-free dilution refrigerator to about 50 mK. First, the amplifier's linear resonance frequency and bandwidth were measured by looking at a reflected phase from the device using a vector network analyzer (VNA). The reflected phase is illustrated in the inset of FIG. 4A and shows a 360° phase roll characteristic of an overcoupled resonator.

Next, by applying current to an external superconducting coil magnet, the linear frequency of the WJBA was tuned with flux. As shown in FIG. 4A, the linear resonance frequency tuned between values of around 11.4 GHz and 9 GHz. By fitting the resonance frequency as a function of flux to the following equation:

$$f(\Phi) = \frac{1}{2\pi \sqrt{C\left(L_{stray} + \frac{\Phi_0}{2\pi d_0 \cos\pi\Phi/\Phi_0}\right)}} \quad (2)$$

the circuit parameters were found to be C≈1 pF, $L_{stray}$≈120 pH and $I_0$≈4.6 µA with error bars of about 10%. From these results, the resonator Q at increased coupling was found to be Q≈100, as desired and in agreement with numerical simulation results.

Figure 4B:
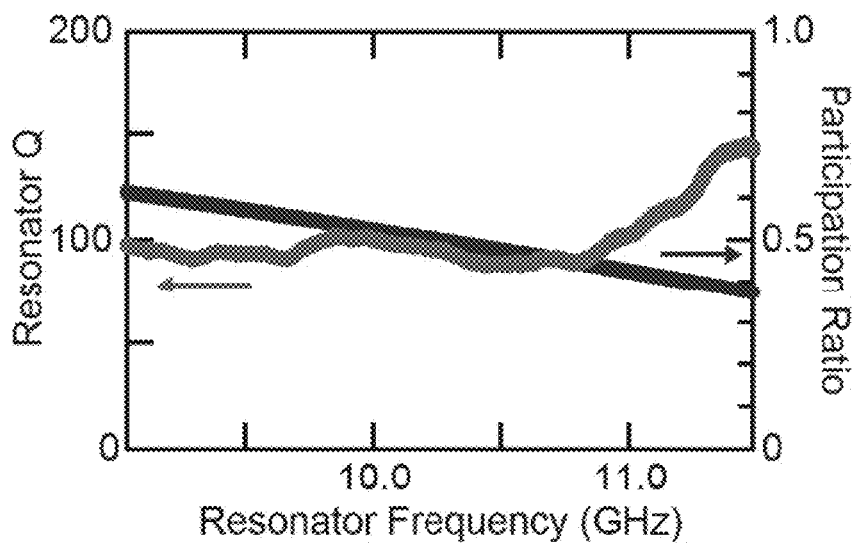
FIG. 4B illustrates dependencies of resonator Q (light-shaded curve) and inductance participation ratio p (dark line) on operational frequency, according to some embodiments.

The measured capacitance was lower than the desired 3.5 pF due to an error in the deposited thickness of the silicon nitride layer, which may be corrected in the fabrication process (e.g., by changing the size of the parallel-plate capacitor, or improving deposition processes). Despite this error, the device still operated in the desired frequency range. More importantly, as shown in FIG. 4B, the Q varied by only 10% between 9 GHz and 11 GHz. Above 11 GHz, the Q changed rapidly, because a higher resonator frequency means the chip is no longer located at an anti-node of the electric field. The almost constant Q as a function of frequency not only agrees well with simulation results but also suggests that the impedance environment is well matched over the frequency range. Because the Q of the WJBA may be varied by changing the antenna length independent of the device frequency, the wireless JBA offers a valuable control knob over the amplifier bandwidth that was unavailable in conventional JBAs. For example, the Q and a corresponding amplifier bandwidth of a WJBA may be tuned by selecting an antenna length and location of antenna in the waveguide 105.

Figure 4C:
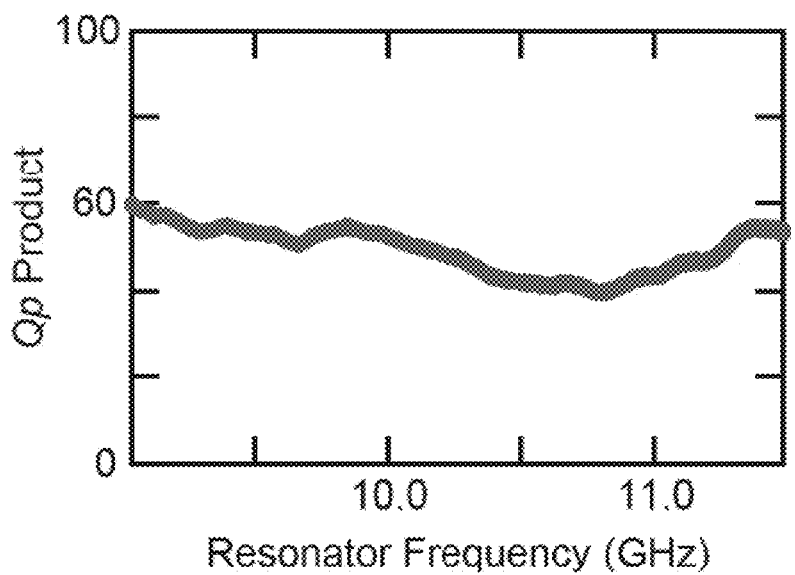
FIG. 4C illustrates dependency of a WJBA Qp product on operational frequency, according to some embodiments.

Using extracted values of $L_{stray}$ and $I_0$ from experimental measurements, the inductance participation ratio p was found to vary between about 0.6 and 0.4 over the measured frequency range, as is indicated by the straight black trace in FIG. 4B. For the tested device, the Qp product was measured to be around 50 and varied by about 20% over the operational frequency range, as shown in FIG. 4C. With a high Qp-product, the WJBA may exhibit increased tunability. Moreover, increased control over the Q and p values for WJBAs allows for more flexibility in tailoring the amplifier's properties (e.g., lowering the Qp product to improve amplifier saturation characteristics, as discussed later).

Figure 5A:
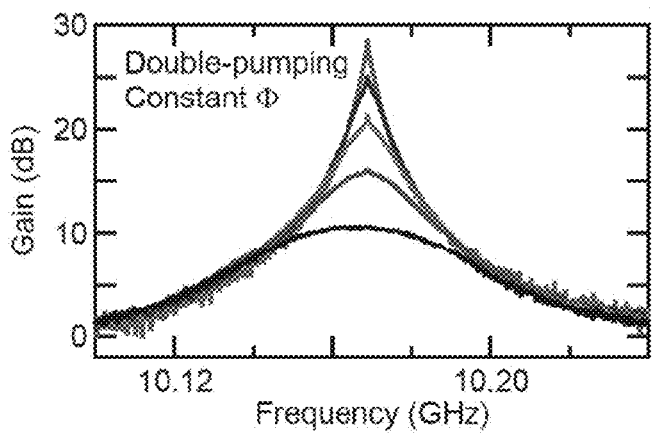
FIG. 5A illustrates dependency of gain of a WJBA as a function of signal frequency for different pump powers, according to some embodiments.

In another set of experimental measurements, a WJBA was characterized as a phase-sensitive amplifier by applying two pump tones, $\omega_{p1}$ and $\omega_2$, that are symmetrically detuned by a fixed amount (in this instance about 500 MHz) from the signal tone at $\omega_s$. The pump tones were applied through the weakly coupled pump port 160. Different gains at the same frequency were achieved by keeping the flux through the SQUID constant while changing the two pump powers. As shown in FIG. 5A, the amplifier achieved gains between 10 dB and over 25 dB. Gains up to 28 dB can be achieved with the tested device. The pump powers varied between about −65.43 dBm to provide a gain of about 28 dB to about −64.14 dBm to provide a gain of about 10 dB. At 20 dB of gain, the instantaneous amplifier bandwidth was found to be about 13 MHz (a value much larger than typical qubit cavity bandwidths).

Figure 5B:
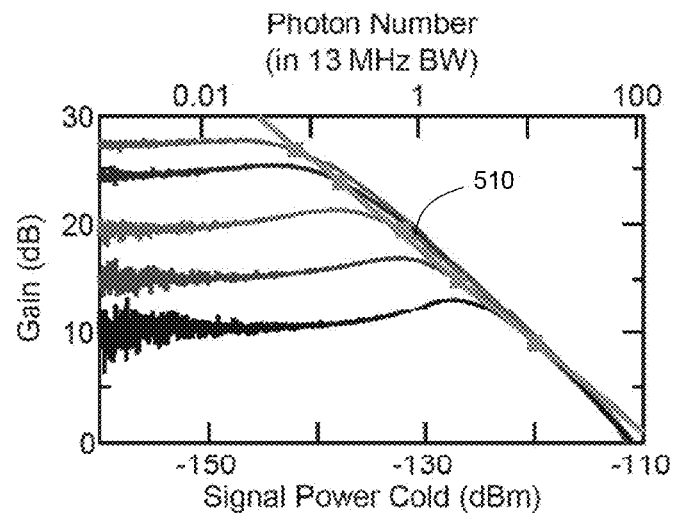
FIG. 5B depicts saturation performance of a WJBA operated at different gain conditions, according to some embodiments.

Next the amplifier's dynamic range was characterized by measuring its maximum gain as a function of input signal power from the VNA, and finding the power at which the gain fell by 1 dB (the $P_{-1dB}$ power). At 20 dB of gain, the saturation power was found to be about −132 dBm, which corresponded to approximately 0.7 photons in the 13 MHz resonator bandwidth, as illustrated in FIG. 5B. Additionally, the slope of $P_{-1dB}$ power versus gain curve 510 was −1.2 dB/dB, close to the ideal slope of −1 dB/dB expected for an ideal linear parametric amplifier. The dynamic range of this device, while comparable to conventional JBAs, could be further increased by reducing the Qp-product by a factor of ten to Qp≈5. While this could be done either by reducing the Q or the p values, the current Q≈100 is desired for qubit readout in some embodiments. Therefore, the participation ratio may be reduced. This can be achieved by using SQUIDs with larger $I_0$ and hence a smaller $L_J$.

Another figure of merit for Josephson-junction-based amplifiers, including parametric amplifiers, is the amplifier's noise temperature, $T_N$. According to some theories, when a WJBA is operated as a phase-sensitive parametric amplifier, the added noise is predicted to be zero for the amplified quadrature ($T_N=0$) while $T_N=\infty$ for the de-amplified quadrature.

The noise temperature $T_N$ for one of the fabricated WJBAs was estimated by looking at an increase in the noise measured by a spectrum analyzer at room temperature when the WJBA was turned on. When the WJBA was off, i.e. G=0, the noise measured at room temperature is entirely added noise from a following HEMT amplifier in the signal detection circuit. On the other hand, when the WJBA is turned on, the measured noise increases because the spectrum analyzer now also receives amplified quantum noise from the parametric amplifier. The amount by which the amplified quantum noise is greater than the added HEMT noise is called the noise rise (NR).

Figure 5C:
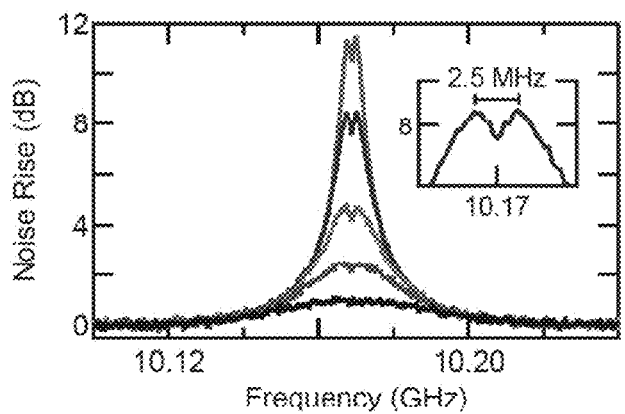
FIG. 5C illustrates noise rise of a WJBA operated at different gain conditions, according to some embodiments.

As shown in FIG. 5C, the noise rise increased with WJBA gain. For example, when G≈25 dB, the noise rise was about 8.5 dB indicating that less than 15% of the power at room temperature was added HEMT noise. The dips in the noise rise at the center frequency were because, at $\omega_s$, the WJBA is a phase-sensitive amplifier; since only one of the two quadratures is amplified, the measured noise rise should be 3 dB lower but the finite resolution bandwidth of the spectrum analyzer smears out the dip. Consequently, the measured dips were smaller than 3 dB (see inset of FIG. 5C) and have a width of 2.5 MHz equal to the spectrum analyzer's resolution bandwidth. At G≈20 dB, the noise rise of 4.5 dB was comparable to other parametric amplifiers, JBAs or JPCs, measured in this experimental setup indicating that the noise performance of the WJBA is comparable to conventional paramps. While using a calibrated noise source or a qubit would be a better way to extract noise temperature, this was not possible in the current experimental setup. Nevertheless, measuring noise rise allows for an estimate of the upper bound on the noise added by a WJBA. A value NR=4.5 dB means that $T_N \leq 2.5 T_Q$, where $T_Q = \hbar\omega_s/2k_B$.

The technology described herein may be embodied as a method, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Additionally, a method may include more acts than those illustrated, in some embodiments, and fewer acts than those illustrated in other embodiments.

The terms "approximately," "substantially," and "about" may be used to mean within ±20% of a target dimension in some embodiments, within ±10% of a target dimension in some embodiments, within ±5% of a target dimension in some embodiments, and yet within ±2% of a target dimension in some embodiments. The terms "approximately," "substantially," and "about" may include the target dimension.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A wireless amplifier comprising:
    at least one Josephson junction fabricated on a substrate;
    at least one radio-frequency antenna connected to the at least one Josephson junction; and
    a microwave waveguide, wherein the substrate is mounted within the microwave waveguide.

2. The wireless amplifier of claim 1, wherein the at least one antenna is located a distance d from a terminating end of the microwave waveguide, wherein $n\lambda_g/2 < d < (n+1)\lambda_g/2$ where n is an integer and $\lambda_g$ represents a fundamental wavelength supported by the waveguide.

3. The wireless amplifier of claim 1, further comprising:
    a signal port connected to the waveguide for applying a signal to be amplified; and
    a pump port connected to the waveguide for applying two pump signals.

4. A method for fabricating a wireless amplifier, the method comprising:
    forming at least one Josephson junction on a substrate;
    forming at least one radio-frequency antenna connected to the at least one Josephson junction; and
    mounting the substrate in a microwave waveguide.

5. The method of claim 4, further comprising locating a first antenna of the at least one antenna in the microwave waveguide a distance d from a terminating end of the microwave waveguide, wherein $n\lambda_g/2 < d < (n+1)\lambda_g/2$ where n is an integer and $\lambda_g$ represents a fundamental wavelength supported by the waveguide.

6. The method of claim 5, wherein a length of the first antenna of the at least one antenna is between about 1 mm and about 5 mm.

* * * * *